United States Patent [19]
Gessert

[11] Patent Number: 5,909,632
[45] Date of Patent: Jun. 1, 1999

[54] USE OF SEPARATE ZNTE INTERFACE LAYERS TO FORM OHMIC CONTACTS TO P-CDTE FILMS

[75] Inventor: Timothy A. Gessert, Conifer, Colo.

[73] Assignee: Midwest Research Institute, Kansas City, Mo.

[21] Appl. No.: 08/937,720

[22] Filed: Sep. 25, 1997

[51] Int. Cl.$^6$ ................................................... H01L 23/48
[52] U.S. Cl. ........................... 438/603; 438/602; 136/256
[58] Field of Search .................................. 438/597, 602, 438/603, 605, 93, 94, 95; 257/741, 743, 744; 136/256

[56] References Cited

U.S. PATENT DOCUMENTS

| | | | |
|---|---|---|---|
| 4,319,069 | 3/1982 | Tyan .......................................... | 136/258 |
| 4,456,630 | 6/1984 | Basol ........................................ | 427/88 |
| 4,568,792 | 2/1986 | Mooney et al. ........................... | 136/260 |
| 4,680,611 | 7/1987 | Basol ........................................ | 136/256 |
| 4,710,589 | 12/1987 | Meyers et al. ............................ | 136/258 |
| 5,293,074 | 3/1994 | Taskar et al. ............................. | 257/744 |
| 5,393,675 | 2/1995 | Compaan .................................. | 437/5 |

OTHER PUBLICATIONS

A. Mondal, "Electrochemical deposition of thin ZnTe films as a contact for CdTe solar cells", Solar Energy Materials and Solar Cells vol. 26, pp. 181–187 (no month given), 1992.

Journal Paper, A. Mondal et al., Solar Energy Materials and Solar Cells 26, 181 (1992). No month.

Journal Paper A. Fahrenbruch., Solar Cells 21, 399 (1987) No month.

Journal Paper, F. Debbagh et al., Solar Energy Materials and Solar Cells 31, 1 (1993). No month.

*Primary Examiner*—Charles Bowers
*Assistant Examiner*—Keith Christianson
*Attorney, Agent, or Firm*—Ken Richardson

[57] ABSTRACT

A method of improving electrical contact to a thin film of a p-type tellurium-containing II-VI semiconductor comprising:

depositing a first undoped layer of ZnTe on a thin film of p-type tellurium containing II-VI semiconductor with material properties selected to limit the formation of potential barriers at the interface between the p-CdTe and the undoped layer, to a thickness sufficient to control diffusion of the metallic-doped ZnTe into the p-type tellurim-containing II-VI semiconductor, but thin enough to minimize affects of series resistance;

depositing a second heavy doped p-type ZnTe layer to the first layer using an appropriate dopant; and depositing an appropriate metal onto the outer-most surface of the doped ZnTe layer for connecting an external electrical conductor to an ohmic contact.

9 Claims, 7 Drawing Sheets

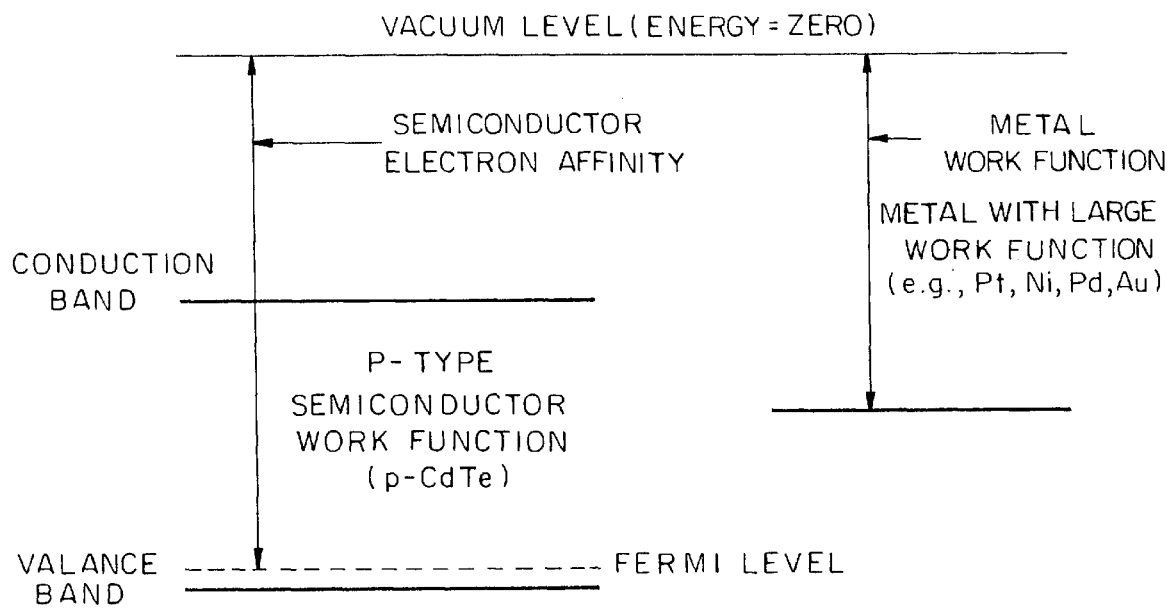
FIG. 2a   FIG. 2b
FIG. 2c
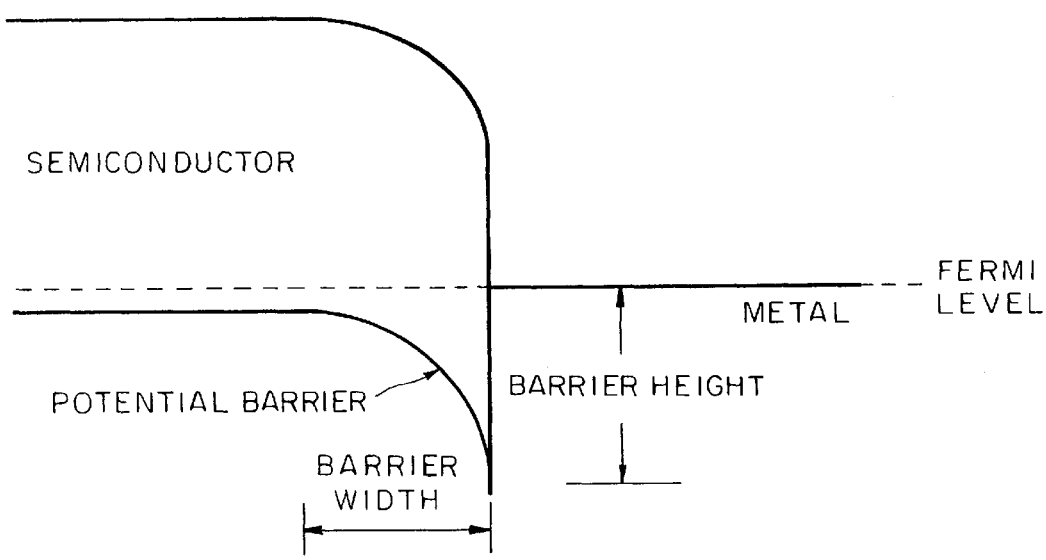

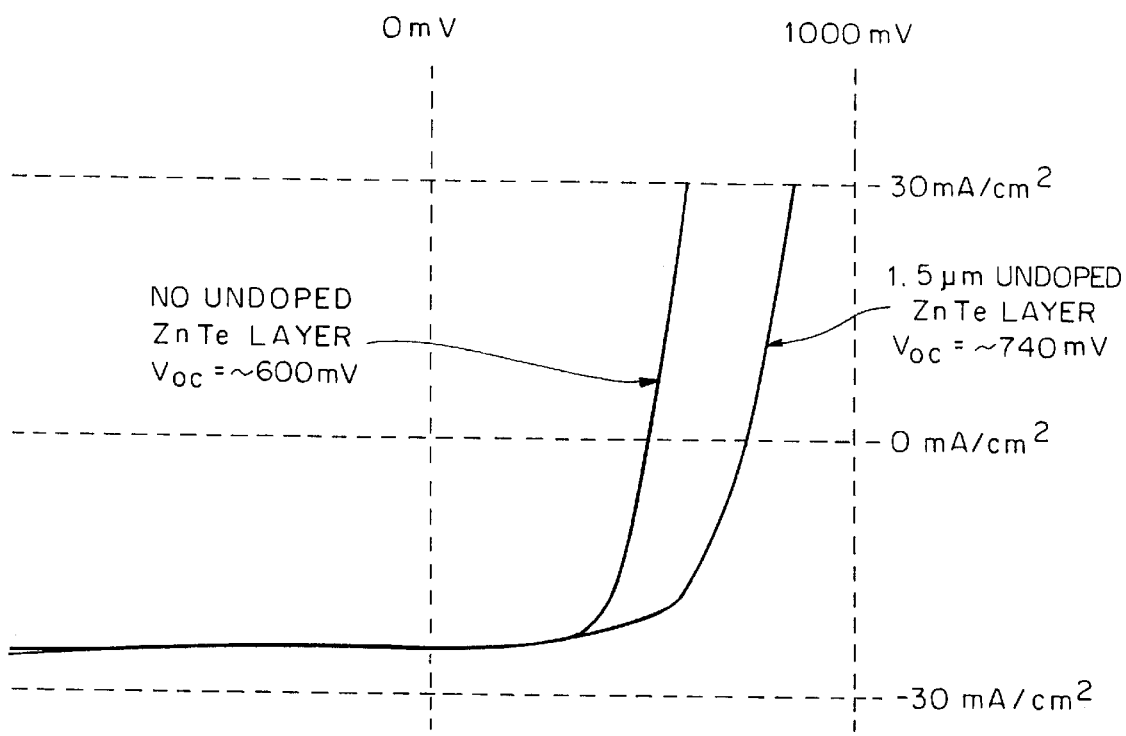

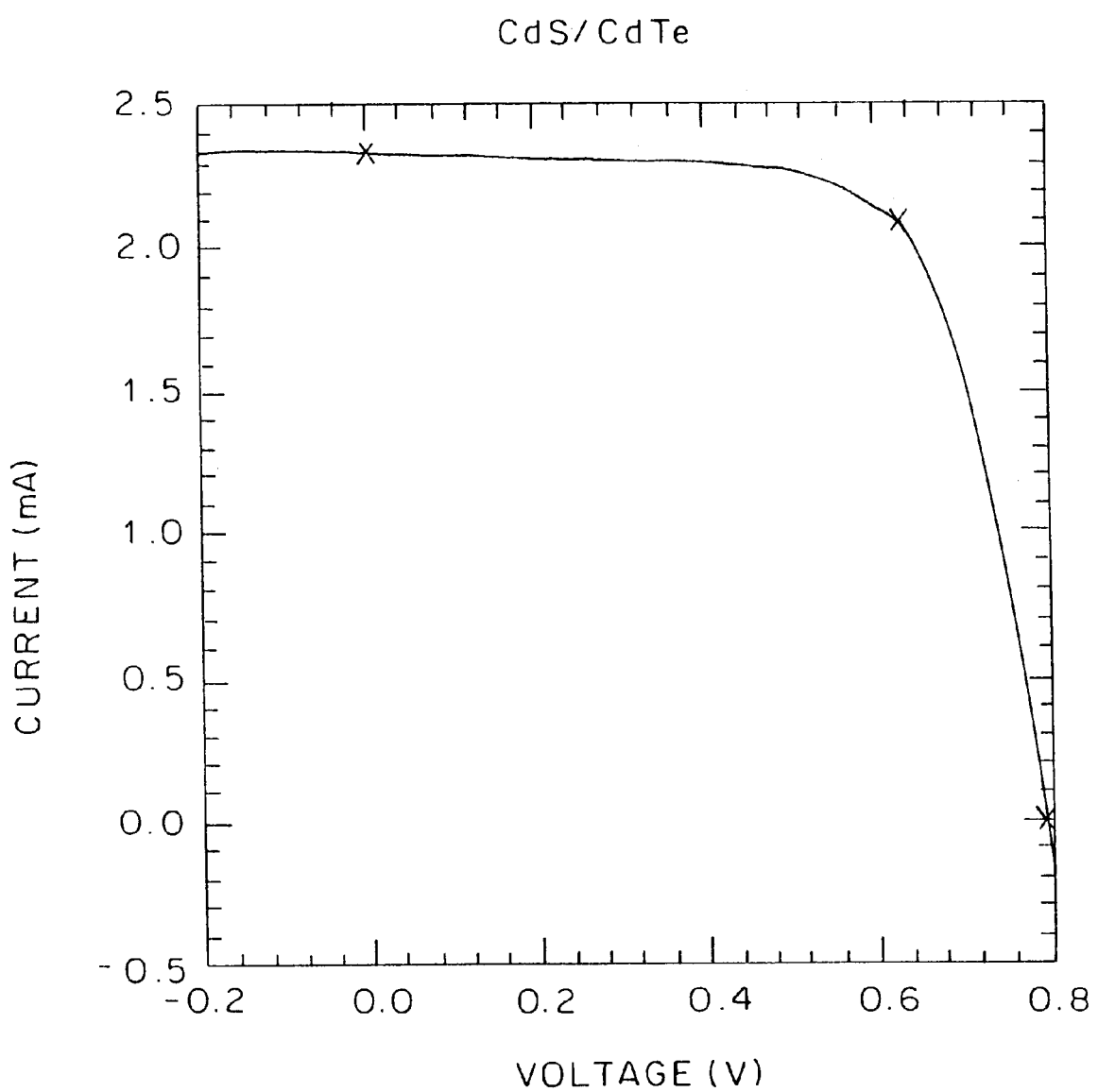

USE OF SEPARATE ZNTE INTERFACE LAYERS TO FORM OHMIC CONTACTS TO P-CDTE FILMS

CONTRACTUAL ORIGIN OF THE INVENTION

The United States Government has rights in this invention pursuant to Contract No. DE-AC36-83CH10093 between the United States Department of Energy and the Midwest Research Institute.

FIELD OF THE INVENTION

This invention relates to the use of two separate ZnTe interface layers to improve electrical contact to p-CdTe thin films, capable of use in photoelectric devices.

The two separate ZnTe thin films are deposited between p-CdTe film and subsequent metallizations. The first film deposited on the p-CdTe is undoped ZnTe, and the second film deposited is doped heavily p-type. The two separate films are used to avoid the drawbacks involved in using a single film to provide optimum device performance. These layers may be used in photovoltaic and other devices to improve device performance by decreasing the losses associated with the back contact and increasing the performance stability of the device.

BACKGROUND OF THE INVENTION

A typical single-junction photovoltaic cell is comprised of a substrate on which to form the device, two ohmic contacts to conduct current to an external electrical circuit, and two or more semiconductor layers in series to form the semiconductor junction. At least one of these semiconductor layers (the absorber) is chosen so that its bandgap is of a value for near-optimum conversion of solar radiation. In the typical design, one semiconductor layer is doped n-type, and the adjacent layer is doped p-type. The intimate proximity of these layers forms a semiconductor p-n junction. The p-n junction provides an electric field that facilitates charge separation in the absorber layer(s) when the cell is illuminated, and charge collection at the ohmic contacts.

In general, the typical photovoltaic cell comprises a substrate to mount the cell and two ohmic contacts to conduct current to an external electrical circuit. In this arrangement, the cell may also include two or more semiconductor layers in series.

In the standard photovoltaic cell including the substrate for mounting the cell and two ohmic contacts for conducting current to an external electrical circuit, in addition to the n-type layer and the p-type layer of a p-n junction cell, a three layer cell can include an intrinsic (i-type) semiconductor layer disposed between the n-type layer and the p-type layer for absorption of light.

In the photovoltaic cell, the semiconductor layers may be formed from single crystalline materials, amorphous materials, or polycrystalline materials. However, single crystalline materials are preferred from an efficiency perspective, because efficiencies are available in excess of about 20% in specific single crystalline photovoltaic cells Nevertheless, the disadvantages associated with single crystalline materials is the high cost of the material as well as the difficulty in depositing the single crystalline materials.

On the other hand, in the case of amorphous materials, one must contend with low carrier mobility, low minority carrier lifetime, low efficiency, and issues of cell stability. Therefore, while single-crystalline and amorphous materials are utilized in some photovoltaic device applications, semiconductor layers composed of polycrystalline materials are viewed as the preferred alternative for the production of photovoltaic devices that would be economically viable for a wide range of applications.

Polycrystalline materials offer numerous advantages for the production of photovoltaic cells. However, there is a desire in the industry of the field of polycrystalline materials to increase the efficiency of the polycrystalline photovoltaic cells from the current efficiencies of about 5–10% range to about a range of about 10–15%, and ultimately to advance the efficiencies of polycrystalline photovoltaic cells closer to the 15–25% range of single-crystalline materials.

Cadmium telluride is a semiconductor with electrical properties recognized in the industry as well suited for conversion of sunlight into electrical energy. The material has a bandgap that is nearly optimum for conversion of terrestrial solar radiation, and the ability to be doped n-type and p-type, that permits the formation of a large range of junction structures.

Nevertheless, there is still extant a need for more efficient and less expensive photovoltaic cells, and in particular, for a more efficient cadmium telluride photovoltaic cell suitable for large scale production. While much of the earlier stages of research on cadmium telluride solar cells was confined to the use of a single crystal cadmium telluride, more recent work has included processes for improving the deposition of cadmium telluride on a substrate. For instance, some examples of deposition processes now available include chemical vapor deposition, electrodeposition, close spaced sublimation, solid-gas reaction, sputtering spray pyrolysis, molecular beam epitaxy, liquid phase epitaxy, and other processes known in the art.

One significant technological problem with CdTe-based devices is that it is difficult to form an ohmic contact to the p-type form of the material. This is observed for both single crystalline and polycrystalline p-type CdTe, and results from a combination of large semiconductor work function, and the inability of CdTe to sustain sufficiently high p-type carrier concentration to enable quantum-mechanical tunneling of charge carriers at the CdTe/metal contact interface. In addition to these fundamental problems, the polycrystalline p-type CdTe material used as the absorber in a CdS/CdTe photovoltaic device is typically treated with Cl-containing liquids or vapors just prior to the formation of ohmic contact. The Cl treatments improve junction performance, but also can produce a CdTe surface that is rich in Cl. Furthermore, the formation of oxide layers from atmospheric oxygen or other processes can alter the chemical properties of the p-type CdTe surface. These factors can effect the electrical transport at the contact interface, and alter the characteristics of the ohmic contact.

The outer surfaces of the p-type CdTe are typically preconditioned prior to application of contact layers by the use of various surface treatments that are known in art. In addition to removing unwanted contamination from the surface, these preconditioning treatments can result in a CdTe surface that is relatively stoichiometric, or a CdTe surface comprised of a Te-rich outer layer. Regardless of the processes used to precondition the CdTe surface, the materials and processes that are subsequently used to produce the outer contact layers must be optimized for the characteristics of the preconditioned CdTe surface so that all interfaces produce low resistance and interface stability.

Typically, the processes used to deposit the outer metallization layers are performed at relatively low temperature to avoid diffusion of the outer contact layers into the CdTe (i.e., less than about 150° C.). This low-temperature processing is undesirable for in-line photovoltaic cell manufacturing processes because higher-temperature processes (greater than about 150° C.) typically occur immediately prior to the contact fabrication. Additionally, it is difficult to attain optimum adhesion of the contact metallization at low temperature, and this can result in reduced contact stability.

Accordingly, there is a need in the art of preparing contacts to the back surface of CdS/CdTe thin-film photovoltaic devices to produce improved contacting processes. Desirable improvements to the contacting process would include: Inherent compatibility with in-line manufacturing processes (i.e., use of "dry processes"); allowance for incorporation of dry processes to precondition the CdTe surface prior to contact fabrication; ability to fabricate the contact at high processing temperatures (>150° C.); ability to choose a variety of outer metallizations depending on industrial design considerations; ability to modify the contacting process to enhance contact stability; and provision to choose processes that minimize waste products.

The present invention encompasses the use of two separate ZnTe films deposited between the pre-conditioned p-CdTe surface and subsequent metallizations as interface layers to improve electrical contact to p-CdTe thin films. The first film deposited (on the p-CdTe) is undoped ZnTe, and the second film deposited is doped heavily p-type. The two separate films are used to avoid the drawbacks associated with using a single film to provide optimum device performance, and these layers may be used in photovoltaic and other devices to improve device performance by decreasing the losses associated with the back contact and by increasing back contact stability.

A heterojunction p-i-n photovoltaic cell having at least three different semiconductor layers formed of at least four different elements comprising a p-type wide band gap semiconductor layer, a high resistivity intrinsic semiconductor layer, used as an absorber of light radiation, and an n-type wide band gap semiconductor layer is disclosed in U.S. Pat. No. 4,710,589. The intrinsic layer is in electrically conductive contact on one side with the p-type layer and on an opposite side with the n-type layer. First and second ohmic contacts are in electrically conductive contact with the p-type layer and the n-type layer.

In U.S. Pat. No. 5,393,675, there is disclosed a process for dry fabrication of CdS/CdTe photovoltaic devices; however, this patent utilizes only a single ZnTe layer, discloses that the ZnTe functions only as the p-type layer of a p-i-n PV structure, and that the contact is provided by metal layers. Further, there is no indication or appreciation that the ZnTe can be doped, and that if a multilayer contact is used, both layers must be metals (e.g., Cu and Au).

Journal Paper, A. Mondal et al., Solar Energy Materials and Solar Cells 26, 181 (1992), discloses first use of electrochemistry to form ZnTe and ZnTe: Cu, and identifies the use of only a single-layer ZnTe: Cu interface.

The use of thin (1–5 nm) Cu layers to dope but not shunt the p-CdTe of a CdS/CdTe device is disclosed in U.S. Pat. No. 4,735,662, in which use of a barrier layer on top of a thin Cu layer is employed to afford selection of other conduction layers. In essence, this patent discloses the use of a metallic layer (~3 nm Cu) to provide the necessary p-type doping in the CdTe to produce a low resistance contact. On this layer is placed both a barrier layer and the thicker conduction layers.

U.S. Pat. No. 4,319,069 discloses chemical treatment of a p-CdTe surface prior to contacting to improve the contact characteristics. $HNO_3$ (oxidizing acid) plus $H_3PO_4$ (leveling agent) is employed to form the Te layer. In this patent, the use of ~5% $HNO_3+H_3PO_4$ chemical pretreatment is used to improve the contact characteristics, and is a subtractive process.

Chemical treatment of a p-CdTe surface prior to contacting to improve the contact characteristics, by use of an oxidizing acid plus a reducing agent (hydrazine or metal alkalide) is disclosed in U.S. Pat. No. 4,456,630. The use of the chemical pretreatment to improve contact characteristic is subtractive processing, and in such a process, generally, there is very limited control over characteristics such as removal rate, selective grain-boundary etching, and thickness of the resulting Te-layer formation.

In, Journal Paper A. Fahrenbruch., Solar Cells 21, 399 (1987), there is a review of technology used to contact polycrystaline p-CdTe up to approximately 1987; and, in Journal Paper, F. Debbagh et. al., Solar Energy Materials and Solar Cells 31, 1 (1993), there is a disclosure of interdiffusion of elemental Cu and Te layers on polycrystalline CdTe.

U.S. Pat. No. 4,568,792 discloses the production of CdS and CdTe ternaries (with Zn, Se, etc.) and makes photovoltaic devices that are better than the standard CdS/CdTe device.

SUMMARY OF THE INVENTION

One object of the invention is to provide improved photovoltaic device performance by decreasing the loses associated with the back contact when using separate ZnTe interface layers.

Another object of the present invention is to provide two separate ZnTe thin films deposited between p-CdTe and subsequent metallizations.

A further object of the present invention is to produce a contact using processes that are inherently compatible with in-line manufacturing processes (i.e., utilize "dry processes") when using separate ZnTe interface layers.

A still further object of the present invention is to produce a contact process that allows for incorporation of various dry processes for pre-conditioning the p-CdTe surface prior to contact fabrication when using separate ZnTe interface layers.

A yet further object of the present invention is to allow fabrication of the back contact at high deposition temperatures (greater than about 150° C.) when using separate ZnTe interface layers.

A further object yet still of the present invention is to produce a contact that allows for use of various outer metallizations when using separate ZnTe interface layers.

Another object of the present invention is to provide improved photovoltaic device performance by increasing the stability of the back contact when using separate ZnTe layers.

Yet, another object of the present invention is to produce a contact process that does not produce significant waste products.

In general, deposition of the two separate ZnTe thin films are deposited between p-CdTe and subsequent metallizations. The first film deposited on the p-CdTe is undoped ZnTe and the second film deposited is doped heavily p-type. The two separate films are used to overcome the drawbacks involved in using a single film to provide optimum device performance, and these layers may be used in photovoltaic and other devices to improve device performance by decreasing the losses associated with the back contact.

BRIEF DESCRIPTION OF THE DRAWINGS

A more complete grasp of the invention and the advantages attendant thereto will be obtained by reference to the detailed description when considered in conjunction with the accompanying drawings.

FIGS. 2a through FIG. 2 illustrates one of the basic problems with contacting semiconductor materials such a p-CdTe and p-ZnSe.

FIG. 2a shows the position, relative to the vacuum level (energy=zero), of the conduction-band, valance-band, and Fermi energy levels for a semiconductor such as a p-CdTe.

FIG. 2b shows, in approximate relationship to the energy levels of the semiconductor, the energy level (i.e., metal work function) that would be associated with a typical metal having a high work function($>5.0$ eV).

FIG. 2c illustrates that when the p-CdTe semiconductor and the high-work function metal are brought into intimate contact, the Fermi level near the surface of the semiconductor will equillibrate with the position of the metal work function. This will cause the conduction and valance bands of the semiconductor to bend downward and form a barrier, as shown in the figure. Depending upon the specific material and electrical properties of the semiconductor and the metal, the barrier will have a specific "width" and "height" as shown in the figure. For the case of p-CdTe and typical metals, the charge carriers will have insufficient energy to flow over the barrier, thus limiting current transport between the metal and the semiconductor. This limitation will lead to contact resistance in the solar cell that can become a part of the total series resistance of the solar cell, and thereby limit cell performance. Note that if a metal with a smaller value of work function is chosen, the barrier height will be even larger, further limiting cell performance. Typically, the resistance associated with this type of contacting problem can be minimized by producing a high p-type carrier concentration in the region in the p-CdTe immediately adjacent to the metal. This technique will produce a barrier width that is sufficiently narrow to allow low-resistance charge transport across the barrier by the process known as quantum-mechanical tunneling. However, because the maximum p-type carrier concentration in CdTe is limited by compensation mechanisms, low-resistance tunneling has not been demonstrated between metals and p-CdTe.

FIG. 6 shows a graph comparing light current-voltage (LIV) characteristics near 1-Sun for two separate CdS/CdTe thin-film photovoltaic devices. In both cases, the CdS/CdTe device material was nominally identical, the substrate temperature during all stages of contact formation was 300° C., the ZnTe:Cu was 0.5 $\mu$m thick and contained ~6 atom % Cu, and the outer metallization was a layer of 0.5-$\mu$m thick Ni that was deposited using d.c.-magnetron sputtering. The device fabricated using only a single layer of ZnTe:Cu demonstrated an open-circuit voltage of ~600 mV. The device fabricated using a two-layer contact interface of the invention (1.5-$\mu$m layer of undoped ZnTe plus 0.5 $\mu$m-thick layer of ZnTe:Cu) demonstrated an open-circuit voltage of ~740 mV.

FIG. 7 shows a LIV characteristic under standard conditions for a CdS/CdTe device incorporating the two-layer ZnTe CIFL of the invention. For this device, the substrate temperature during all stages of contact formation was 300° C., the undoped ZnTe layer was 1.5 $\mu$m thick, the ZnTe:Cu was 0.5-$\mu$m thick and contained ~6 atom % Cu, and the outer metallization was a 0.5-$\mu$m thick layer of Ni deposited by d.c.-magnetron sputtering.

DESCRIPTION OF THE PREFERRED EMBODIMENTS

Prior to formation of the contact to p-CdTe by the processes described herein (i.e., sequential deposition of undoped ZnTe, doped ZnTe, and a metallization), it is necessary to condition the surface of the p-CdTe to remove unwanted contamination and produce a surface of a reproducible and desirable stoichiometry. In accordance with this invention, it was found that wet-chemical etching, using etching procedures that are known to those skilled in the art, could be utilized to condition the p-CdTe surface to produce a quality contact.

It was also determined that appropriate conditioning of the CdTe surface can be accomplished by use of the "dry process" of ion-beam milling. To initiate the process of ion-beam milling for this application, the CdS/CdTe is placed into a chamber that is evacuated to pressures >1e-5 torr through the use of appropriate high vacuum pumps.

The sample is oriented on a sample holder with the p-CdTe side of the sample facing apparatus capable of generating Ar atoms into ions of preferred energy and directionality (i.e., and ion source). The sample may be positioned on a sample holder that allows for sample heating, and/or impart movement to the sample and thereby improve the uniformity of the ion-beam exposure.

Once the high vacuum is established within the processing chamber, the ion source is ignited, and the sample is exposed to energetic Ar atoms and ions (100–1000 eV) During ion exposure, the source-to-substrate distance is maintained such that it is less than the diffusion length of the Ar atoms and ions at the vacuum pressure (i.e., >500 mm for a chamber pressure of 1e-5 torr). During sample exposure, the directionality of the source beam may be varied from normal incidence to oblique angles, thereby allowing substrate movement.

Additionally, the fixed angle of the ion gun may be non-normal.

In accordance with the invention, the experiments used in developing this invention utilized an ion source with an aperture of 3 cm, and exposure angles of 90° and 45° were used. The time of ion beam exposure is typically less than five minutes, and changes in device performance are related to the exposure time.

Figure 1:
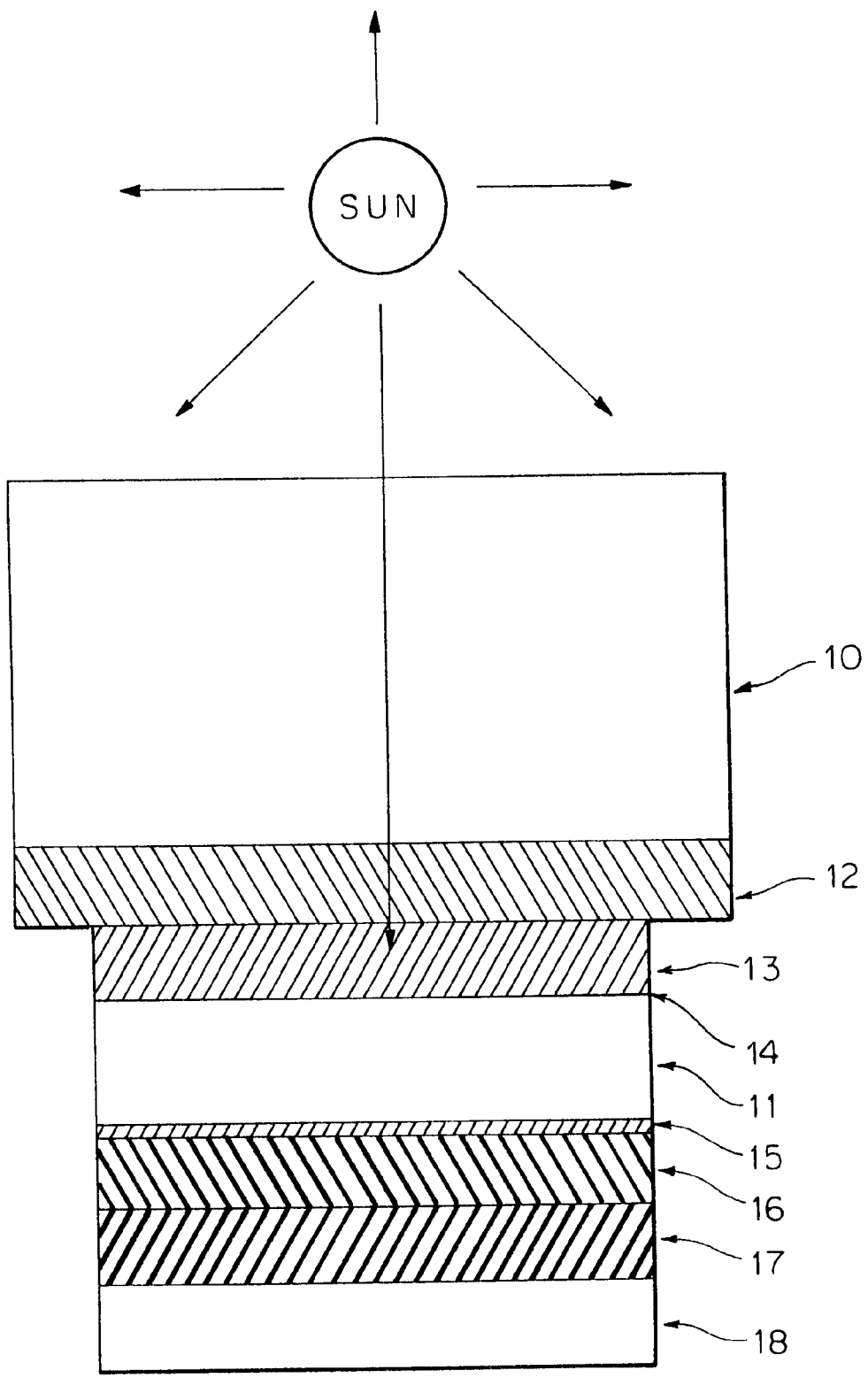
FIG. 1 shows the various layers of a typical CdS/CdTe solar cell configuration.
Figure 3:
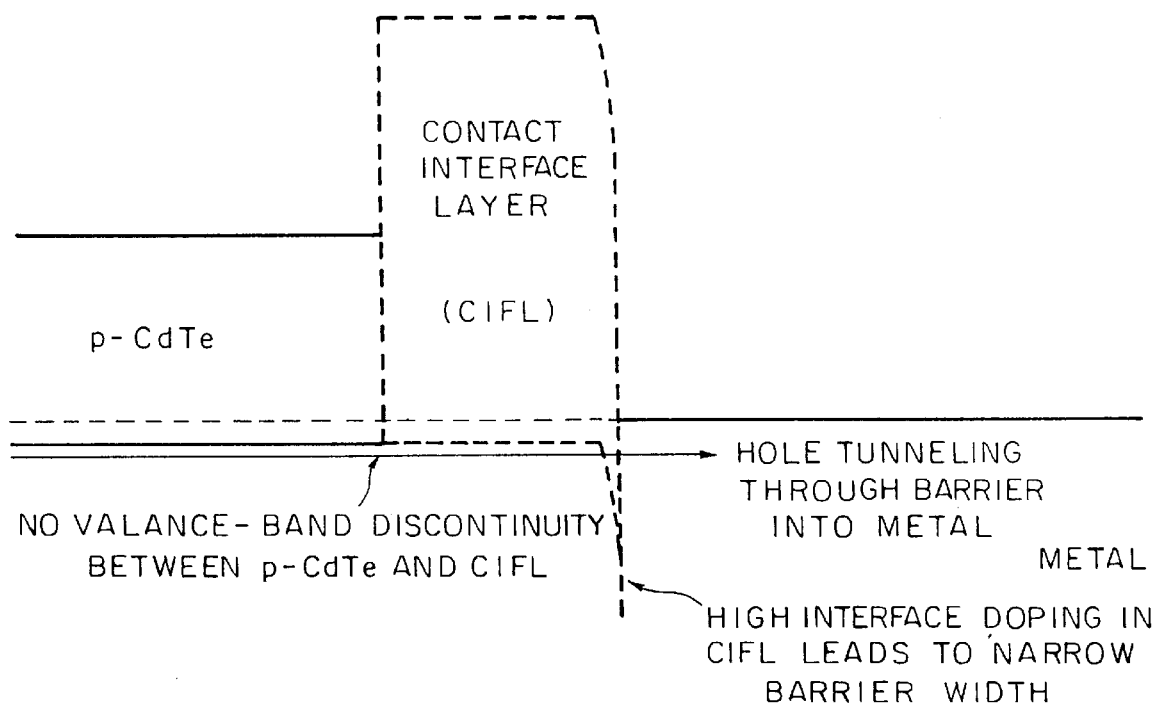
FIG. 3 shows an energy-band diagram illustrating an idealized resolution of the problems associated with forming low-resistance ohmic contact to p-CdTe. In this idealized situation, a single layer contact interface layer (CIFL) is placed between the p-CdTe and the outer metallization. The CIFL is chosen so that it produces a small discontinuity at the valance band and also produces a sufficiently high p-type carrier concentration to facilitate quantum-mechanical tunneling of charge between CIFL and outer metallization.
Figure 4A:
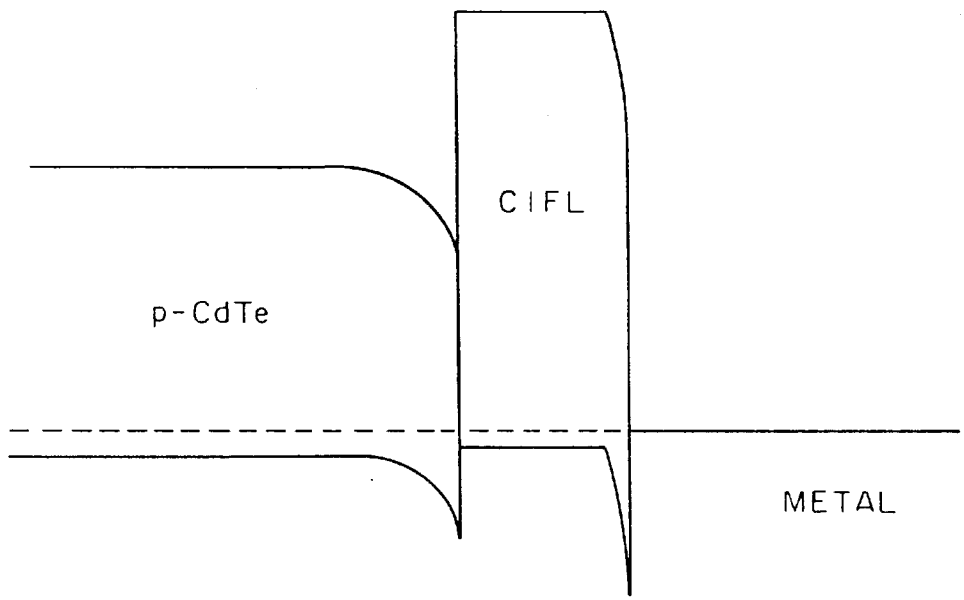
FIG. 4a illustrates a potential problem in a contact produced using a single-layer CIFL. The figure shows a case in which a significant valance-band discontinuity (i.e., potential barrier) has formed between the p-CdTe and the CIFL. A barrier such as this would result if the interface Fermi level were pinned toward mid gap in the p-CdTe, or if the semiconductor work function of the CIFL were not well matched with the p-CdTe. In this situation, current transport at CIFL/metal interface can proceed via low-resistance tunneling, however, the device may still experience significant contact resistance because of the barrier formed at the p-CdTe/CIFL interface. Although it may be possible to minimize the effect of the p-CdTe/CIFL barrier through proper choice of materials and processes used to fabricate the CIFL, this approach is limited by the requirement to choose CIFL material and parameters to minimize resistance at the CIFL/metal interface.
Figure 4B:
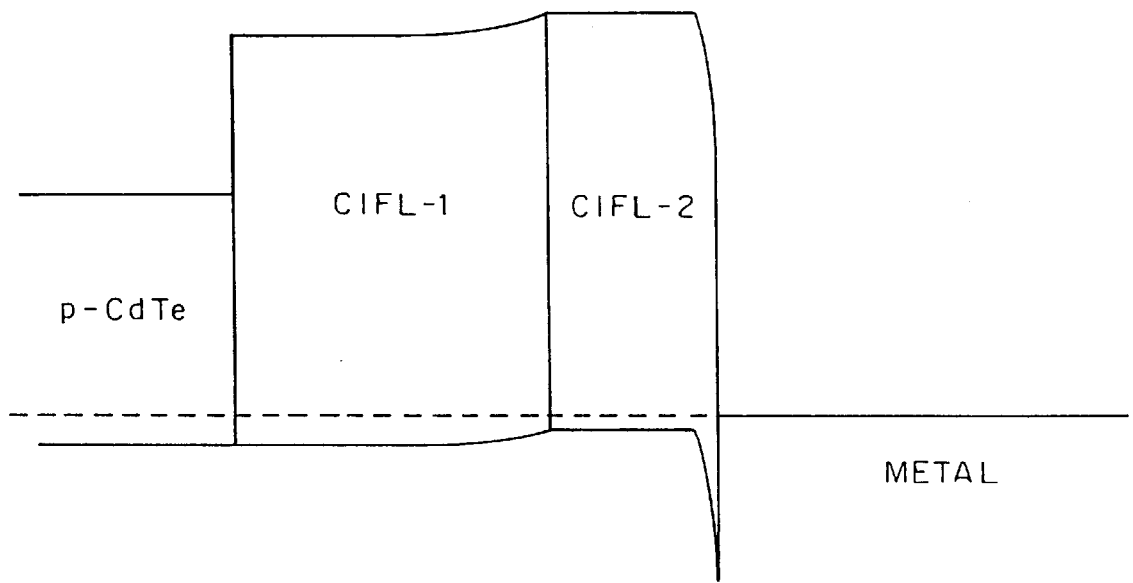
FIG. 4b illustrates a contact in which the barrier between the p-CdTe and the CIFL may be eliminated through the proper choice of material and deposition parameters of an initial CIFL layer (CIFL-1), while parameters of a subsequent CIFL layer (CIFL-2) are chosen to minimize resistance at the CIFL-2/metal interface. In the present invention, undoped ZnTe has been used for CIFL-1, and Cu-doped ZnTE has been used for CIFL-2.
Figure 5A:
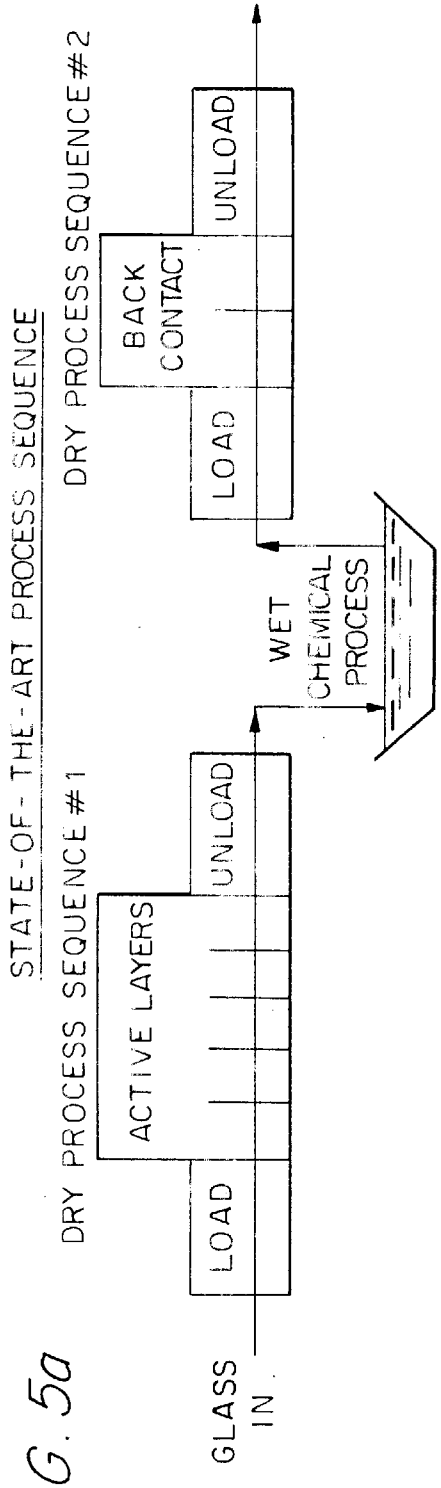
FIGS. 5a and 5b show a flow diagram illustrating the state-of-the-art process sequence for CdS/CdTe photovoltaic cell manufacture, and a flow diagram illustrating an improved process sequence that results from the incorporation of this invention, respectively. Because this invention allows one of the contact interface layers (i.e., CIFL-11) to be chosen to optimize the p-CdTe/CIFL-1 interface, processes such as wet chemistry can be eliminated from the device fabrication sequence. The diagrams show that by eliminating the wet chemical process, some components of the process sequence can be eliminated, and the process can be streamlined.
Figure 5B:
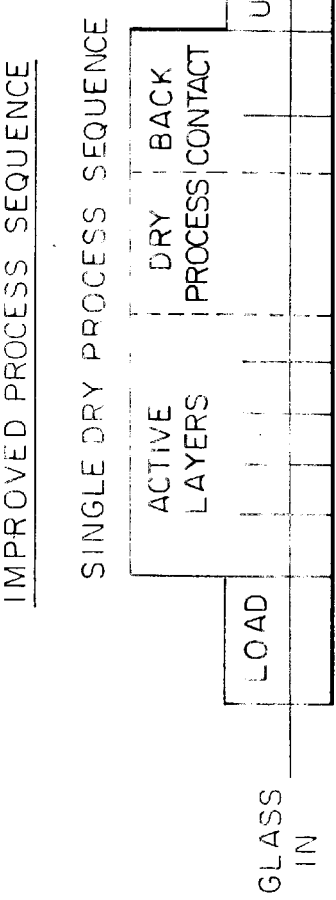

The average performance values for ion-beam processed CdS/CdTe devices (from 4 cells) are as follows:

the stability of the contact by minimizing unwanted metal diffusion from outer contact layers, allow for contact formation at high temperature, allow for the use of dry process for preconditioning of the p-CdTe surface prior to contacting, and allow for the choice of various outer metallizations. More importantly, the process is a "dry process" and therefore is inherently compatible with in-line manufacturing and does not produce significant waste products. In FIG. 1 configuration, the light enters through the glass substrate 10. The substrate 10 is typically called a superstrate when the cell is designed to have the light incident on the substrate side. The light is absorbed predominantly in the p-CdTe layer 11. The figure shows the location of the transparent-conducting oxide (TCO) layer 12 that forms the transparent electrical top contact to the n-type CdS layer 13, and the location of the semiconductor n-p junction 14 between the n-CdS and p-CdTe. The figure shows the location of the pre-conditioned p-CdTe surface 15. The figure also shows the location of the layer of undoped ZnTe 16, and the location of the doped ZnTe layer (ZnTe:Cu) 17. The figure also shows the location of the outer metallization layer(s) or metal back contact layers 18. Selection of materials for the outer metallization layers(s) can be based on the criteria of the particular device fabrication process.

EXAMPLE I

Deposition of ZnTe Layers and Processing Variable:

The first layer deposited onto the pre-conditioned p-CdTe surface is undoped ZnTe. The physical and material prop-

TABLE

| Sample Id Comment | Voc | Jsc | FF | n | Rseries | Rshunt |
|---|---|---|---|---|---|---|
| UC232A No IB (Best) | 809 mV | 20.5 mA/cm$^2$ | 65.6% | 10.9% | 15 Ohm-cm2 | 990 Ohm-cm2 |
| UC240A Meth + IB (First) | 805 mV | 21.3 mA/cm$^2$ | 65.4% | 11.25% | 10.05 Ohm-cm2 | 2274 Ohm-cm2 |
| UC240B NP + IB (First) | 784 mV | 21.3 mA/cm$^2$ | 58.5% | 9.78% | 19.75 Ohm-cm2 | 1409 Ohm-cm2 |
| UC264#2 Meth + IB (Best) | 809 mV | 21.6 mA/cm$^2$ | 71% | 12.2% | 6.9 Ohm-cm2 | 1176 Ohm-cm2 |

Once the p-CdTe surface has been appropriately conditioned using a wet or dry process, the contact process described herein can begin. If the surface has been conditioned using a wet-chemical process, the sample must be placed into a vacuum system capable of evacuation to pressures <1e-5 torr through the use of appropriate vacuum pumps. If the sample has been conditioned using a dry process, using processing similar to those described above (i.e. Ion Beam Milling), then the same vacuum chamber can be used for the contact processing described herein.

The sample is positioned in the vacuum chamber and in a sample holder with the conditioned p-CdTe side of the sample facing apparatus capable of deposition of both an undoped ZnTe layer, and a ZnTe layer doped with an appropriate dopant such as Cu. While deposition can be provided by physical or chemical source, the studies used to develop this invention utilized i.e., r.f.-magnetron sputtering of pressed-powder targets. The device sample holder can allow for sample heating, and/or impart movement to the sample and thereby improve the uniformity of deposition. Once the sample is loaded into the processing chamber, and the chamber is evacuated to a high vacuum, high purity Ar gas is admitted to establish the appropriate chamber required for sputter deposition (typically, about 1e-2 torr).

Deposition of ZnTe Layers and Processing Variables

The process of the invention is used to reduce the performance losses associated with the ohmic contact, improve erties of the undoped layers are optimized to limit the formation of a potential barrier at the interface between the p-CdTe and the undoped layer, control diffusion of the Cu from the Cu-doped ZnTe into the p-CdTe, but thin enough to minimize effects of series resistance on the device performance. Processing variables that can be utilized to optimize the performance of this layer include substrate (sample) temperature, deposition rate, layer thickness, and substrate d.c. bias. For the studies used to develop this invention, the substrate temperature was 300° C., and the undoped layer thickness was between 0.0–1.5 μm.

The second layer is composed of ZnTe doped p-type to a degenerate carrier concentration (>5e 18 cm$^{-3}$) using an appropriate dopant. Processing variables for the deposition of this layer include substrate dopant type and concentration, substrate temperature, deposition rate, layer thickness, and substrate d.c. bias. For the studies used to develop this invention, the dopant used was metallic Cu (pressed into the powder target) at a concentration of ~6 atom %, the substrate temperature was 300° C., and the layer thickness was ~0.5 μm. Changes in device performance can be related to many of the processing variables controlled during the deposition of the two ZnTe layers.

Once the ZnTe layers are deposited, an appropriate metal is deposited onto the outer-most surface (i.e., the doped ZnTe layer). For the studies used to develop the invention, ~0.5 μm of Ni was d.c.-magnetron sputter deposited as the outer metal layer. The Ni was deposited immediately following the deposition of the ZnTe layers while the substrate was maintained at about 300° C. However, because of the degenerate acceptor concentration of the outer ZnTe layer, the choice of metal does not significantly alter the specific contact resistance of the contact. Therefore, the choice of metal can be guided primarily by other processing and/or manufacturing constraints.

From FIG. 6, it is clearly illustrated that there is a significant improvement in the light current-voltage (LIV) characteristics of the CdS/CdTe thin-film photovoltaic (PV) device following the incorporation of an undoped ZnTe layer of a thickness of about 1.5 μm. Specifically, the open-circuit voltage increases from 600 mV to ~740 mV for the cell that incorporates the undoped layer of this invention. All other contact and cell fabrications parameters were held constant for this comparison, the only difference being the presence of the undoped ZnTe layer. FIG. 7 illustrates that optimization can result in cell performance exceeding 12% for measurements conducted using standardized conditions.

While the invention has been described with reference to preferred embodiments, it is to be understood that variations and modifications may be made within the disclosed invention without departing from the spirit and scope of the invention, which is defined in the appended claims.

I claim:

1. A method of improving electrical contact to a thin film of a p-type tellurium-containing II-VI semiconductor comprising:

depositing a first undoped layer of ZnTe on a thin film of a p-type tellurium-containing II-VI semiconductor with material properties selected to limit the formation of potential barriers at the interface between said p-type tellurium-containing II-VI semiconductor and said first undoped layer, to a thickness sufficient to control diffusion of a metallic-undoped ZnTe into the p-type tellurium-containing II-VI semiconductor, but thin enough to minimize affects of series resistance;

depositing a second heavily doped p-type ZnTe layer onto said first undoped layer using an appropriate dopant; and depositing an appropriate metal onto the outer-most surface of said heavily doped ZnTe layer for connecting an external electrical conductor to an ohmic contact.

2. The method of claim 1 wherein said second heavily doped p-type ZnTe is doped p-type to degenerate carrier concentration of >5e 18 $cm^{-3}$.

3. The method of claim 2 wherein said p-type tellurium-containing II-VI is p-CdTe.

4. The method of claim 3 wherein the substrate temperature of the p-CdTe is about 300° C.

5. The method of claim 4 wherein the dopant in the ZnTe heavily doped p-type layer is metallic Cu.

6. The method of claim 5 wherein said metallic Cu dopant is at a concentration of ~6 atom %.

7. The method of claim 6 wherein Ni is the metal deposited on said ZnTe doped p-CdTe layer.

8. The method of claim 7 wherein the thickness of Ni deposited as the outer-most layer is ~0.5 μm.

9. The method of claim 7 wherein the substrate temperature during Ni deposition is about 300° C.

* * * * *